United States Patent [19]

Bacuvier

[11] 4,245,232
[45] Jan. 13, 1981

[54] OVER-VOLTAGE CLIPPING DIODE

[75] Inventor: Pierre Bacuvier, Tours, France

[73] Assignee: Le Silicium Semiconducteur SSC, Paris, France

[21] Appl. No.: 969,415

[22] Filed: Dec. 14, 1978

[30] Foreign Application Priority Data

Dec. 15, 1977 [FR] France .................................. 77 37857

[51] Int. Cl.³ ..................... H01L 23/32; H01L 23/16; H01L 23/42
[52] U.S. Cl. ........................................ 357/76; 357/75; 357/79; 357/81
[58] Field of Search ...................... 357/72, 75, 76, 79, 357/81

[56] References Cited

U.S. PATENT DOCUMENTS

| 2,516,344 | 7/1950 | Ross et al. | 357/72 |
| 2,897,420 | 7/1959 | Butt | 357/75 |
| 3,179,855 | 4/1965 | Brombaugh | 357/76 |
| 3,183,407 | 5/1965 | Yasuda et al. | 357/76 |
| 3,210,618 | 10/1965 | Rosenberg | 357/72 |
| 3,356,914 | 12/1967 | Whigham et al. | 357/76 |
| 3,363,150 | 1/1968 | Whitman et al. | 357/76 |
| 3,532,941 | 10/1970 | Boyer | 357/76 |
| 3,551,757 | 12/1970 | Kristensen | 357/75 |

FOREIGN PATENT DOCUMENTS 1973009 11/1967 Fed. Rep. of Germany ............ 357/76

Primary Examiner—Andrew J. James
Attorney, Agent, or Firm—Cushman, Darby & Cushman

[57] ABSTRACT

An over-voltage clipping diode comprising a plurality of serial elementary diode chips. Each diode chip is sandwiched between two distributor blocks made of a material which has a high thermal conductivity and a high thermal capacity with respect to the semi-conductive material of the diode chips.

5 Claims, 3 Drawing Figures

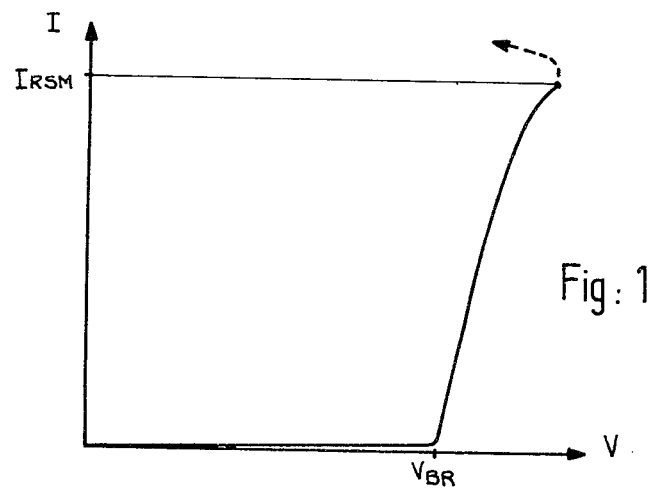
Fig. 1
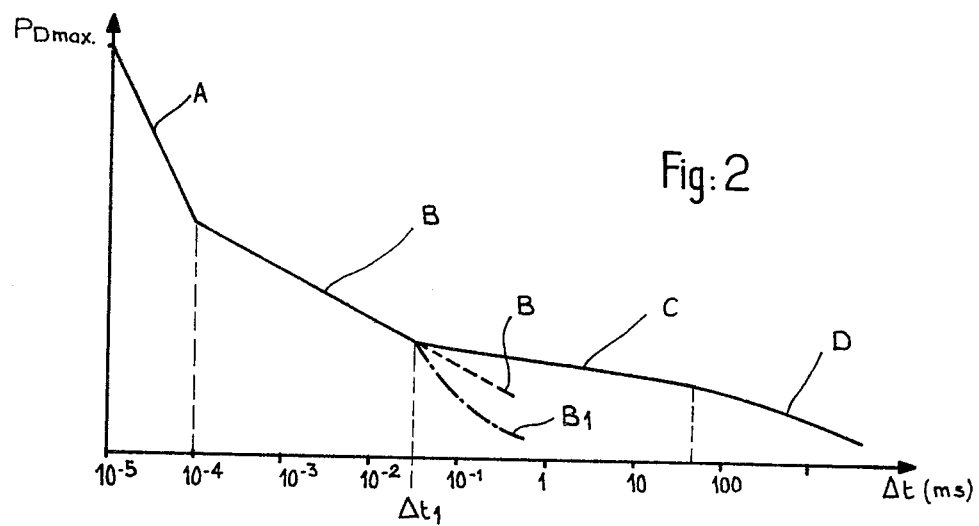
Fig. 2
Fig. 3
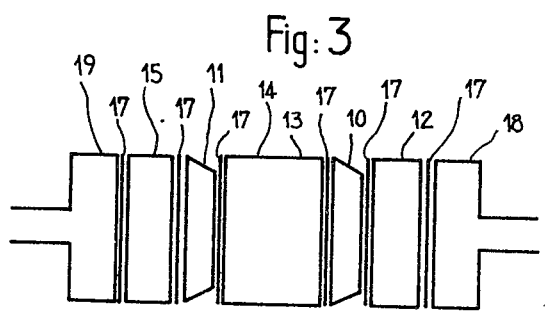

OVER-VOLTAGE CLIPPING DIODE

BACKGROUND OF THE INVENTION

1. Fields of the Invention

The invention relates to over-voltage clipping diodes and more particularly to such diodes comprising P-N junction operating in the avalanche mode.

2. Description of the Prior Art

Those devices can be used for implementing protecting components operative against occasionnal electric overloads. They permit coverage of a large voltage range (from some volts to voltages in the range of 1,000 volts) and are generally adapted to the energy of the current overloads. Their very great response rate (some picoseconds) can also be used for cooperating with other security circuits during the first instants of an over-voltage. The dynamic resistance is relatively low in the avalanche mode, which is favourable to the limitation of a potential increase in the presence of overcurrents, mostly when the avalanche voltage is low.

the protection diode or clipping diode aims to limit the applied voltage onto circuits to be protected, with respect to various electrical perturbations.

As a matter of fact, various electrical perturbations may occur at the terminals of an electronic network and damage or destroy the same. Those parasitic perturbations originate either from the electrical neighbourhood of the apparatus or from atmospheric phenomenons. For example, as regards a telephone line, lightning discharge will have to be absorbed by the clipping diode.

A P-N junction clipping diode, also often called PIN or PNN+ diode, indicating that this diode comprises outermost regions highly doped in the opposite type and an intermediate region forming the junction with the opposite type region, is substantially similar in its structure to a rectifying diode.

Thus, in the current practice, the diode manufacturers have often considered the over-voltage clipping avalanche diodes in the same way as the rectifying diodes as regards their connections, their mounting and their encapsulation.

SUMMARY OF THE INVENTION

The invention relies onto a theoretical analysis of the clipping diodes wherein attention has been focused onto the fact that those diodes are to operate only in the inverse breakdown mode and during very short time durations (in the range of the absorbed parasitic perturbations). Accordingly, the thermal characteristics of a diode in the dynamic mode have been thoroughly studied for improving the life time characteristics of the over-voltage clipping diodes.

As shown in FIG. 1, the current-voltage characteristic (I-V) of a PNN+ diode in the reverse mode is such as this diode corresponds substantially to an open circuit up to a given voltage $V_{BR}$, then this characteristic presents a marked knee so that the voltage remains substantially constant while the current increases through the diode up to a value $I_{RSM}$. Over this value $I_{RSM}$, the avalanche causes the occurrence of a negative resistance which causes a sudden filamentation (striction) of the current lines which, in view of the important intensities and powers implied, causes the local melting of the silicon and therefore the destruction of the components and the shorting of the diode. Accordingly, the point $I_{RSM}$ corresponding to the beginning of this breakover constitutes a physical limit for the operation of the diode. The position of this breakover limit will depend upon the physical parameters of the structure and upon the properties of the applied electrical stress and in particular upon its duration.

In the greatest number of the cases, for voltages not exceeding some hundreds of volts, this limit will be associated with the thermal generation of carriers close to the junction. This will be called thermal breakover. Thus, the thermal breakover will occur when the temperature at the neighbourhood of the junction will be over a critical temperature $T_C$. Accordingly, one of the main basis of the invention lies in the fact that the inventor has been aware of the fact that the temperature T close to the junction is closely correlated with the electrical nature of the over-voltage and the transitory thermal dissipations.

It has to be recalled that, for a diode, the avalanche threshold $V_{BR}$ is a function of the doping $N_D$ of the intermediary region or region N in case of a PNN+ diode as indicated in the following table I.

TABLE I

| $N_D$ (atoms/cm³) | $V_{BR}$ (volts) |
|---|---|
| $10^{14}$ | 1 700 V |
| $10^{15}$ | 300 V |
| $10^{16}$ | 60 V |

However, the critical temperature $T_C$ is also dependant upon the doping $N_D$ as indicated in the following table II.

TABLE II

| $N_D$ | $T_C$ |
|---|---|
| $10^{14}$ | 225° C. |
| $10^{15}$ | 325° C. |
| $10^{16}$ | 425° C. |

On the other hand, as regards the transitory thermal phases caused in the PNN+ structure by an overload, it will be noted that, according to the overload duration, a more or less important part of the elements surrounding the active chip will be implied in the phenomenon. In fact, the electrical power is dissipated substantially locally and mainly in the space charge area of the diode.

The temperature increase will mainly be dependent upon propagation phenomena and the overload time duration will be fundamental as regards the internal parts implied.

The limiting incidence of the various parts of the component on the maximum overload capacity will be closely associated with the duration of the surge wave.

With respect to overloads having a very short time duration $\Delta t$, for example in the range of 0.1 microsecond, the thermal propagation length in the silicon can be neglected with respect to the thickness of the space charge region. The temperature increase is then limited only by the thermal capacity of this space charge region. The maximum power $P_{Dmax}$ which can be dissipated by the diode is then of the type $$P_{Dmax} \sim \frac{1}{\Delta t}.$$

For example, for avalanche voltages in the range of 50 volts, the calculations give limit powers in the range of 30 kilowatts per square millimeter.

For overloads having a time duration higher than some microseconds, the thermal propagation length in the silicon is substantially higher than the thickness of the heat generation region and it is the thermal propagation speed in the silicon which has to be considered. For example, for $\Delta t = 10$ microseconds, the propagation length L in the silicon amounts to about 25 microns. The junction being generally at a distance comprised between some microns and one hundred microns, for example in the range of 30 microns, from the surface of the silicon chip, it is the silicon parameters which are of importance and it can be shown that the limit power $P_{Dmax}$ for an overload having a time duration $\Delta t$ is essentially given by the following relation:

$$P_{Dmax} \sim \frac{K_{Si} dc_{Si}}{\Delta t}$$

where $K_{Si}$ is the thermal conductivity of the silicon in W/°C.cm and dc the bulk thermal capacity of the silicon (J/cm$^3$.°C.). For example, the calculations show that for $V_{BR} = 50$ volts and $\Delta t = 10$ microseconds, $P_{Dmax} = 4$ kilowatts per mm$^2$.

For overloads of larger time duration, having a time duration higher than substantially 10 microseconds, the thermal wave extends out of the silicon and the mounting structural parts of the diode external to the silicon chip have to be taken into account.

Thus, by taking into account the theoretical analysis, the invention provides an over-voltage clipping diode comprising a plurality of diode chips serially mounted in the same conduction direction, each of those diode chips being sandwiched between two distributing blocks made of a material having a high thermal conductivity and a higher thermal capacity with respect to the semi-conductor material of the diode. The thickness of said distributor blocks is higher than the propagation length of a thermal wave in this material for the maximum pulse duration to be applied to the clipping diode.

BRIEF DESCRIPTION OF THE DRAWINGS

Those features and advantages of the invention and others will be explained in detail in the following description of preferred embodiments made in connection with the attached drawings, wherein:

FIG. 1 generally shows the characteristics of an avalanche diode usable as a clipping diode;

FIG. 2 shows a curve illustrating the maximum dissipable power $P_{Dmax}$ in a clipping diode as a function of the time duration of a parasitic pulse applied ($\Delta t$ in milliseconds); and FIG. 3 schematically shows a structure of an over-voltage clipping diode according to the invention.

DESCRIPTION OF THE PREFERRED EMBODIMENTS

The main features of the invention will be recited hereunder in connection with FIG. 2 which schematically summarizes some of the theoretical results explained above. So, FIG. 2 shows the maximum power $P_{Dmax}$ dissipable in a clipping diode as a function of the time duration $\Delta t$ of the applied pulse. Generally, it clearly appears that the larger the pulse duration is, the lower is the maximum dissipable power and this although the dissipated energy (product of the power by the time duration) is an increasing function of $\Delta t$.

FIG. 2 indicates that the study of the maximum dissipable power is divided into two main regions. In the first region comprising the curve portions A and B, only the characteristics of the silicon are of concern. In the second region comprising the curve portions C and D, the parts of the diode structure external to the semi-conductive chip itself have to be taken into account.

As explained in the above, the region A corresponds to the characteristics of the space charge region for very short overloads; the region B corresponds, for very short overloads, to the thermal dissipation in the silicon outside the space charge region.

When one wishes to manufacture a clipping diode chip having specified characteristics, that is presenting in particular a pre-determined avalanche threshold voltage, one obtains determined curves A and B on which it is not possible to have an influence.

According to a first aspect of the invention it is provided, for obtaining an avalanche diode having a determined threshold voltage, to use not a single diode chip but a plurality of serial diode chips which will have each to dissipate a fraction of the applied voltage. For diode chips having the same cross-section, one accordingly multiply the dissipable power by the number of diode chips used. However, this obvious result is not correct. In fact, if one serially connect n diodes, each one having a threshold voltage equal to the n$^{th}$ of the threshold voltage of the whole diode, the doping of the intermediate layer of each of the elementary diode chips will be increased as indicated in the above table I. Correlatively, as indicated in the above table II, when the doping concentration increases, the critical temperature at which one can raise a diode without causing the breakover phenomenon increases. The gain due to the serial connection of a plurality of diodes will therefore be larger than a simple multiplication of the maximum dissipable power by the number of diode chips used.

Therefore, as long as the applied pulses are shorter than the pulse time duration $\Delta t_1$ corresponding to the intersection between the curves B and C of FIG. 2, that is the pulse duration for which the propagation length of the thermal wave in the silicon gets higher than the distance between the space charge region and the limit of the diode chip, the invention provides a gain of the dissipable power higher than the multiplication by the number of chips.

According to another aspect of the invention, it is provided to sandwich a diode chip between thermal distributor blocks permitting to have a better dissipation than in the silicon for maintaining the property according to which the dissipable power for two chips, for example, is higher than twice the dissipable power for a single chip. Therefore, according to the invention, a material wherein the propagation speed of the thermal wave is higher than the propagation speed in the silicon has to be chosen, this material having a thermal conductivity and a bulk thermal capacity higher than the ones of the silicon.

The following table III indicates the thermal propagation parameters of various materials permitting to make a choice.

TABLE III

| | Cu | Ag | Au | Al | W | Mo | Fe | Ni | Si | Sn | Pb |
|---|---|---|---|---|---|---|---|---|---|---|---|
| L(μ) | | | | | | | | | | | |

TABLE III-continued

|  | Cu | Ag | Au | Al | W | Mo | Fe | Ni | Si | Sn | Pb |
|---|---|---|---|---|---|---|---|---|---|---|---|
| for Δt = 10μs L(μ) | 38 | 48 | 40 | 33 | 29 | 27 | 16 | 14 | 23 | 22 | 17 |
| for Δt = 1 ms L(μ) | 380 | 480 | 400 | 330 | 290 | 270 | 160 | 140 | 230 | 220 | 170 |
| for Δt = 10 ms | 1200 | 1530 | 1230 | 1060 | 930 | 850 | 500 | 460 | 740 | 690 | 540 |
| $\dfrac{1}{\sqrt{Kdc}}$ | 0,27 | 0,31 | 0,37 | 0,43 | 0,47 | 0,50 | 0,57 | 0,53 | 0,77 | 1 | 1,4 |

Table III shows that one of the preferred materials to be used as a distributor is copper for which the propagation length corresponding to a given pulse time duration is not too high and for which the coefficient $1/\sqrt{Kdc}$, characterizing the heating of the material, is among the lowest. However, of course, other materials can be used; for example silver is a satisfactory material.

If one wishes to implement a diode having a threshold voltage of 50 volts, it will be possible, as indicated in FIG. 3, to use two diode chips 10 and 11, each having an avalanche threshold voltage of about 25 volts. Each diode is sandwiched between two distributor blocks (12, 13, 14 and 15). Of course, the blocks 13 and 14 can be integral. The various diode chips are assembled with the distributor blocks through bonding means 17, for example made of aluminium, for permitting a welding or an alloying. Finally, the whole structure is mounted between two electrodes 18 and 19. Refering to the above table III, if one considers that the longer parasitic pulse to be clipped by a diode according to the invention is of 10 milliseconds, inasmuch as each of the blocks 12, 13, 14 and 15 has a thickness higher than about 1.5 mm, the dissipable power of a diode according to the invention is shown by the curve comprising the curve portions A, B and C shown in FIG. 2. For wider pulses, the encapsulation parameters, illustrated by the curve portion D, will have to be taken into account and are limiting the dissipable power. Thus, according to the invention, the distributor blocks 12, 13, 14 and 15 have to be chosen with a thickness higher than the propagation length of the thermal wave, for the maximum pulse duration to be clipped by the diodes according to the invention. Of course, FIG. 3 shows a diode comprising two elementary diode chips but a larger number can be used according to the invention.

An important aspect of the invention lies in the fact that, contrary to the case of the rectifying diodes, the heat sinks surrounding the diode have not a great importance and the main effect of thermal dissipation is assumed by the distributor blocks. Thus, according to an advantage of the invention, a plurality of elementary diode chips and a corresponding plurality of distributor blocks can be mounted in the classical case commonly used for a rectifying diode comprising a single chip and heat sinks of more important size.

The invention has been disclosed in the above only in connection with over-voltage clipping diodes. In fact, it does not apply to rectifying diodes for which the fact to share a diode into a plurality of elementary diode chips presents the drawback to increase the direct voltage drop which is generally wished to be a minimum in case of rectifying diodes.

Additionally, for a rectifying diode, the dynamic thermal propagation phenomenons have little importance with respect to the static phenomenons and the distributor blocks according to the invention will have no utility.

It should be noted that the above specifically described embodiments are merely exemplary, and do not portray the limits of the invention.

What I claim is:

1. An over-voltage clipping diode comprising a plurality of diode chips serially arranged in the same conduction direction, each of said diode chips being sandwiched between two distributor blocks of a material having a high thermal conductivity and a large thermal capacity with respect to the semi-conductive body of the respective diode chips, the thickness of the distributor blocks being larger than the thermal propagation length in the material for the pulses having the maximum time duration to be clipped by the diode.

2. An over-voltage clipping diode according to claim 1 wherein the distributor blocks are made of silver.

3. An over-voltage clipping diode according to claim 1 wherein the distributor blocks are made of copper.

4. An over-voltage clipping diode according to claim 1 wherein the distributor blocks are assembled with the elementary diode chips by alloying bonding means of a material such as aluminium or any other known material.

5. An over-voltage clipping diode according to claim 1 wherein the two adjacent distributor blocks of two adjacent diode chips are integral.

* * * * *